(12) United States Patent
Nakada et al.

(10) Patent No.: US 10,937,951 B2
(45) Date of Patent: *Mar. 2, 2021

(54) MAGNETORESISTANCE EFFECT ELEMENT

(71) Applicant: TDK CORPORATION, Tokyo (JP)

(72) Inventors: Katsuyuki Nakada, Tokyo (JP); Kazuumi Inubushi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 240 days.

This patent is subject to a terminal disclaimer.

(21) Appl. No.: 15/911,689

(22) Filed: Mar. 5, 2018

(65) Prior Publication Data

US 2018/0254409 A1  Sep. 6, 2018

(30) Foreign Application Priority Data

Mar. 3, 2017  (JP) .............................. JP2017-040819

(51) Int. Cl.
| H01F 10/193 | (2006.01) |
| H01F 10/32 | (2006.01) |
| H01L 43/10 | (2006.01) |
| H01F 1/00 | (2006.01) |
| H01L 43/08 | (2006.01) |

(52) U.S. Cl.
CPC ........... H01L 43/10 (2013.01); H01F 1/0036 (2013.01); H01F 10/1936 (2013.01); H01F 10/3268 (2013.01); H01L 43/08 (2013.01)

(58) Field of Classification Search
None
See application file for complete search history.

(56) References Cited

U.S. PATENT DOCUMENTS

| 6,876,522 B2 | 4/2005 | Ambrose et al. | |
| 7,957,106 B2* | 6/2011 | Carey | B82Y 25/00 360/324.1 |
| 2003/0197986 A1* | 10/2003 | Ambrose | B82Y 10/00 360/324.11 |
| 2004/0114283 A1 | 6/2004 | Felser | |
| 2007/0109693 A1* | 5/2007 | Carey | H01L 43/10 360/324.12 |
| 2007/0297103 A1* | 12/2007 | Zhang | B82Y 10/00 360/324.12 |

(Continued)

FOREIGN PATENT DOCUMENTS

| JP | 2004-524689 A | 8/2004 |
| JP | 2012-190914 A | 10/2012 |
| WO | 2013/035148 A1 | 3/2013 |

OTHER PUBLICATIONS

Felser et al. (Apl. Mat. 3, 051518, 2015). (Year: 2015).*

(Continued)

*Primary Examiner* — Kevin M Bernatz
(74) *Attorney, Agent, or Firm* — Oliff PLC (57) ABSTRACT

A magnetoresistance effect element according to an aspect of the present disclosure includes a first ferromagnetic layer as a magnetization fixed layer including a ferromagnetic Heusler alloy, a second ferromagnetic layer as a magnetization free layer including a ferromagnetic Heusler alloy, and a nonmagnetic spacer layer provided between the first ferromagnetic layer and the second ferromagnetic layer, and the nonmagnetic spacer layer includes a nonmagnetic Fe group, Co group, or Ni group Heusler alloy.

9 Claims, 3 Drawing Sheets

(56) References Cited

U.S. PATENT DOCUMENTS

| | | | |
|---|---|---|---|
| 2011/0084429 A1 | 4/2011 | Felser | |
| 2012/0168838 A1* | 7/2012 | Marukame | H01L 21/84 257/295 |
| 2013/0050876 A1* | 2/2013 | Covington | G11B 5/6005 360/234 |
| 2014/0209142 A1* | 7/2014 | Hayakawa | H01L 37/00 136/205 |

OTHER PUBLICATIONS

Kasai et al. "Large magnetoresistance in Heusler-alloy-based epitaxial magnetic junctions with semiconducting Cu (In0.8Ga0.2)Se2 spacer." Applyied Physics Letters, 2016, vol. 109, pp. 032409-1-032409-4.

Furubayashi et al. "Structure and transport properties of current-perpendicular-to-plane spin valves using Co2FeAl0.5Si0.5 and Co2MnSi Heusler alloy electrodes." Journal of Applied Physics, 2010, vol. 107, pp. 113917-1-113917-7.

Goripati et al. "Bi-quadratic interlayer exchange coupling in Co2MnSi/Ag/Co2MnSi pseudo spin-valve." Journal of Applied Physics, 2011, vol. 110, pp. 123914-1-123914-7.

* cited by examiner

MAGNETORESISTANCE EFFECT ELEMENT

TECHNICAL FIELD

The present disclosure relates to a magnetoresistance effect element.

BACKGROUND

In recent years, a giant magnetoresistance (GMR) effect element and a tunnel magnetoresistance (TMR) effect element including a magnetoresistive layer in which a ferromagnetic layer, a nonmagnetic spacer layer, and a ferromagnetic layer are stacked in this order have attracted attention as an element for a new magnetic field sensor or nonvolatile random access magnetic memory (MRAM) application.

For such a device application, a magnetoresistance effect element in which a high magnetoresistive ratio (MR ratio) can be obtained in a range of area resistance (RA) of about 0.1 $\Omega um^2$ to 0.5 $\Omega um^2$ has been required in recent years. As such an element, for example, Non-Patent Document 1 below has proposed a GMR element in which a Co group Heusler alloy is used for a ferromagnetic layer, and $Cu(In_{1-x}Ga_x)Se_2$ (hereinafter may be referred to as "CIGS") is used for a nonmagnetic spacer layer.

Non-Patent Document 1: S. Kasai, et. al., "Large magnetoresistance in Heusler-alloy-based epitaxial magnetic junctions with semiconducting $Cu(In_{0.8}Ga_{0.2})Se_2$ spacer", Appl. Phys. Lett., 109, 032409 (2016)

SUMMARY

In the magnetoresistance effect element described in Non-Patent Document 1, a Co group Heusler alloy having a high spin polarizability is used as a material constituting the ferromagnetic layers of the magnetoresistive layer. Therefore, a high MR ratio can be obtained as described.

However, Non-Patent Document 1 describes that variation in a value of RA is great among a plurality of magnetoresistance effect elements having the configuration as described above. Specifically, in a magnetoresistance effect element in which the Co group Heusler alloy is used for the ferromagnetic layers of the magnetoresistive layer and CIGS is used for the nonmagnetic spacer layer, the value of RA among the plurality of elements varies by about one order of magnitude in a range of about 0.3 $\Omega um^2$ to 3 $\Omega um^2$, as is described in (b) of FIG. 4 of Non-Patent Document 1. Such variation in RA is a major obstacle in practical application of the magnetoresistance effect element, but causes of and countermeasures for this variation have not yet been clarified.

The present disclosure has been made in view of the above points, and an object of the present disclosure is to provide a magnetoresistance effect element in which a ferromagnetic Heusler alloy is used for a ferromagnetic layer of a magnetoresistive layer, in which variation in a value of RA is able to be reduced.

In order to solve the above problem, a magnetoresistance effect element according to an aspect of the present disclosure includes a first ferromagnetic layer as a magnetization fixed layer including a ferromagnetic Heusler alloy; a second ferromagnetic layer as a magnetization free layer including a ferromagnetic Heusler alloy; and a nonmagnetic spacer layer provided between the first ferromagnetic layer and the second ferromagnetic layer, wherein the nonmagnetic spacer layer includes a nonmagnetic Fe group, Co group, or Ni group Heusler alloy.

According to the magnetoresistance effect element of the aspect of the present disclosure, since the nonmagnetic spacer layer includes the nonmagnetic Fe group, Co group, or Ni group Heusler alloy, Fe, Co, or Ni that is a magnetic element contained in the nonmagnetic spacer layer can be caused to be present near an interface between the first ferromagnetic layer and the nonmagnetic spacer layer and near an interface between the second ferromagnetic layer and the nonmagnetic spacer layer. Accordingly, it is thought that the stability of magnetization directions of the first ferromagnetic layer and the second ferromagnetic layer near the interfaces is improved. As a result, variation in a value of RA of the magnetoresistance effect element can be reduced.

Further, in the magnetoresistance effect element according to the aspect of the present disclosure, the nonmagnetic spacer layer may include a nonmagnetic Fe group Heusler alloy. In this case, Fe that is a magnetic element can be caused to be present near the interface between the first ferromagnetic layer and the nonmagnetic spacer layer and near the interface between the second ferromagnetic layer and the nonmagnetic spacer layer. Accordingly, it is thought that the stability of magnetization directions of the first ferromagnetic layer and the second ferromagnetic layer near the interfaces is particularly improved. As a result, variation in a value of RA of the magnetoresistance effect element can be particularly reduced.

Further, in a case where the nonmagnetic spacer layer includes a nonmagnetic Fe group Heusler alloy, the nonmagnetic Heusler alloy may include the element Fe, an element L, and an element M, the element L may be one or more elements selected from a group consisting of Ti, Zr, Hf, V, Nb, Ta, Cr, Mo, W, Sc, and Y, and the element M may be one or more elements selected from a group consisting of Si, Ge, Sn, Al, Ga, In, Zn, Cd, Hg, Mg, Ca, Sr, Ba, P, As, Sb, and Bi.

By selecting such types of material, a small energy gap can be formed near a Fermi level of the nonmagnetic Heusler alloy, and electrical conduction characteristics of the nonmagnetic Heusler alloy can be semiconductive characteristics. Accordingly, it becomes easy to set the value of RA of the magnetoresistance effect element to a desired value.

Further, in a case where the nonmagnetic spacer layer includes a nonmagnetic Fe group Heusler alloy, the nonmagnetic Heusler alloy may contain the element Fe, an element L, and an element M, the element L may be one or more elements selected from a group consisting of Ti, Zr, Hf, V, Nb, Ta, Sc, and Y, and the element M may be one or more elements selected from a group consisting of Si, Ge, Sn, Al, Ga, In, P, As, Sb, and Bi.

By selecting such types of material, it becomes easy to set the value of RA of the magnetoresistance effect element to a desired value for the same reasons as described above. Further, in the periodic table of the elements, groups to which the element L belongs and the element M belongs and a group to which Fe belongs can be greatly separated from each other. Accordingly, it is possible to reduce element substitution between Fe and elements L or M in the nonmagnetic Heusler alloy of the nonmagnetic spacer layer. As a result, variation in the value of RA of the magnetoresistance effect element can be further reduced.

Further, in a case where the nonmagnetic spacer layer includes a nonmagnetic Fe group Heusler alloy, the nonmagnetic Heusler alloy may include the element Fe, an element L, and an element M, the element L may be one or more elements selected from a group consisting of Ti, Zr, Hf, Sc, and Y, and the element M may be one or more elements selected from a group consisting of Si, Ge, Sn, P, As, Sb, and Bi.

By selecting such types of material, it becomes easy to set the value of RA of the magnetoresistance effect element 1 to a desired value for the same reasons as described above. Further, in the periodic table of the elements, groups to which the element L belongs and the element M belongs and a group to which Fe belongs can be further greatly separated from each other. Accordingly, it is possible to further reduce element substitution between Fe and elements L or M in the nonmagnetic Heusler alloy of the nonmagnetic spacer layer. As a result, variation in the value of RA of the magnetoresistance effect element can be further reduced.

Further, in the magnetoresistance effect element according to the aspect of the present disclosure, the nonmagnetic Heusler alloy may have a B2 structure or a $L2_1$ structure.

Accordingly, it is possible to increase the amount of Fe, Co, or Ni which is a magnetic element contained in the nonmagnetic spacer layer present near the interface between the first ferromagnetic layer and the nonmagnetic spacer layer and near the interface between the second ferromagnetic layer and the nonmagnetic spacer layer, as compared with a case in which the nonmagnetic spacer layer has an A2 structure. As a result, since the stability of the magnetization directions of the first ferromagnetic layer and the second ferromagnetic layer near the interfaces is further improved, variation in a value of RA of the magnetoresistance effect element can be further reduced.

Further, in the magnetoresistance effect element according to the aspect of the present disclosure, the ferromagnetic Heusler alloy included in the first ferromagnetic layer and/or the second ferromagnetic layer may include a Heusler alloy expressed by a composition formula of $Co_2QR$, Q may be one or more elements selected from a group consisting of Cr, Mn, and Fe, and R may be one or more elements selected from a group consisting of Al, Si, Ga, Ge, In, and Sn.

Accordingly, it is possible to increase a spin polarization ratio of the ferromagnetic Heusler alloy included in the first ferromagnetic layer and/or the second ferromagnetic layer. Therefore, an MR ratio of the magnetoresistance effect element increases.

Further, in the magnetoresistance effect element according to the aspect of the present disclosure, the ferromagnetic Heusler alloy included in the first ferromagnetic layer and/or the second ferromagnetic layer may include a Heusler alloy expressed by a general formula (1).

$$Co_2Q_\alpha R_\beta \qquad (1)$$

In the formula, Q is one or more elements selected from a group consisting of Cr, Mn, and Fe, R is one or more elements selected from a group consisting of Al, Si, Ga, Ge, In, and Sn, and $2<\alpha+\beta<2.6$.

In the ferromagnetic Heusler alloy expressed by the general formula (1), when $\alpha+\beta\leq 2$, substitution of Co with the Q site and the R site easily occurs, and a decrease in the spin polarization ratio of the ferromagnetic Heusler alloy is easily caused. On the other hand, when $2.6\leq\alpha+\beta$, the amount of magnetization of the ferromagnetic Heusler alloy easily decreases, and therefore, magnetic characteristics of the ferromagnetic Heusler alloy easily deteriorate. Therefore, due to a condition of $2<\alpha+\beta<2.6$ being satisfied in the ferromagnetic Heusler alloy, half metal characteristics of the ferromagnetic Heusler alloy are easily maintained, and therefore, a higher MR ratio can be obtained.

According to the present disclosure, a magnetoresistance effect element in which a ferromagnetic Heusler alloy is used for a ferromagnetic layer of a magnetoresistive layer, in which variation in a value of RA is able to be reduced is provided.

DETAILED DESCRIPTION

Hereinafter, embodiments of the present disclosure will be described. Note that the following disclosure exemplifies some of the embodiments of the present disclosure, but the present disclosure is not limited to these embodiments, and any embodiments are included in the scope of the present disclosure as long as the embodiments include the technical ideas of the present disclosure. Respective configurations, combinations thereof in the respective embodiments, or the like are merely examples, and additions, omissions, substitutions, and other changes to the configurations can be performed without departing from the spirit of the present disclosure.

Figure 1:
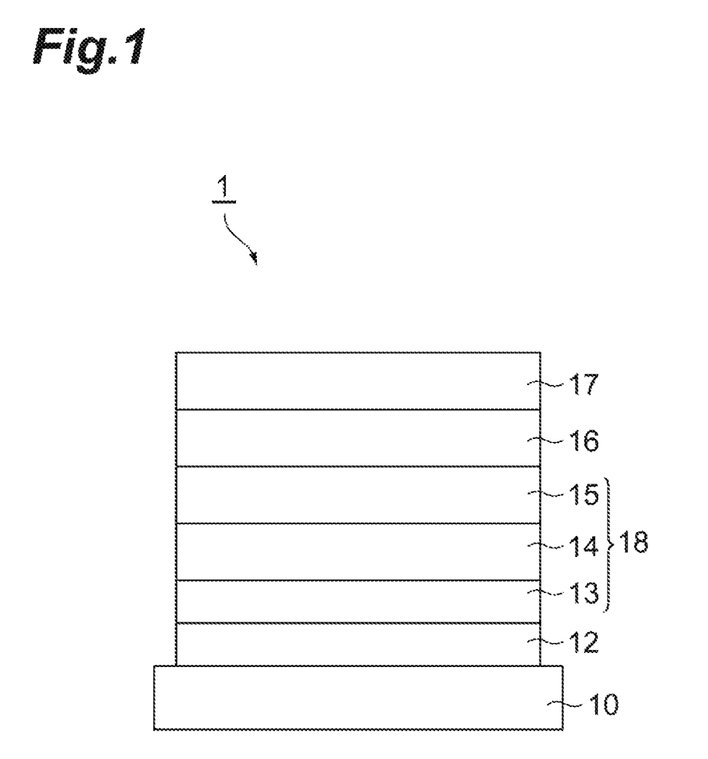
FIG. 1 is a cross-sectional structural view of a magnetoresistance effect element 1 according to an embodiment.

FIG. 1 is a cross-sectional structural view of a magnetoresistance effect element 1 according to an embodiment. The magnetoresistance effect element 1 is a giant magnetoresistive effect (GMR) element having a CPP structure that causes a current to flow in a direction perpendicular to a film surface. As illustrated in FIG. 1, the magnetoresistance effect element 1 includes a substrate 10, an underlayer 12, a magnetoresistive layer 18, and a cap layer 17 in this order. The magnetoresistive layer 18 includes a first ferromagnetic layer 13 as a magnetization free layer, a second ferromagnetic layer 15 as a magnetization fixed layer, a nonmagnetic spacer layer 14 provided between the first ferromagnetic layer 13 and the second ferromagnetic layer 15, and an antiferromagnetic layer 16.

A material constituting the substrate 10 is not particularly limited as long as the material is a material having appropriate mechanical strength and suitable for heat treatment and microprocessing. Examples of the substrate 10 include a metal oxide single crystal substrate, a silicon single crystal substrate, a silicon single crystal substrate with a thermal oxide film, a sapphire single crystal substrate, a ceramic substrate, a quartz substrate, and a glass substrate. A MgO single crystal substrate is particularly suitable. By using a MgO single crystal substrate which is a general-purpose substrate as the substrate 10, it is possible to easily obtain epitaxial growth films by using a known technology. Accordingly, the magnetoresistance effect element 1 having high MR characteristics can be obtained.

The underlayer 12 is an electrode for allowing a detection current to flow and contains at least one metal element such as Ag, Au, Cu, Cr, V, Al, W, Pt or the like. The underlayer 20 may include an alloy of these metal elements or a laminate of materials including two or more of these metal elements. An example of such an alloy of metal elements includes a cubic-type material such as an AgZn alloy, an AgMg alloy, or a NiAl alloy.

Note that a crystal orientation layer (not illustrated) for controlling a crystal orientation of an upper layer may be provided between the substrate 10 and the underlayer 12.

The crystal orientation layer may include a layer containing at least one kind of MgO, TiN, and NiTa alloys. Further, a lower electrode (not illustrated) for allowing a current to flow through the magnetoresistance effect element 1 in a stacking direction may be provided between the substrate 10 and the underlayer 12.

The first ferromagnetic layer 13 functioning as a magnetization free layer is formed of a soft magnetic material, and a magnetization direction thereof is not substantially fixed. Therefore, when an external magnetic field that is a measurement target is applied, the magnetization direction easily changes in a direction thereof. A magnetization direction of the second ferromagnetic layer 15 functioning as a magnetization fixed layer is more difficult to change as compared with the magnetization direction of the first ferromagnetic layer 13 with respect to an external magnetic field. Preferably, the magnetization direction of the second ferromagnetic layer 15 is substantially fixed with respect to an external magnetic field that is a measurement target, and does not substantially change with respect to an external magnetic field that is a measurement target. When an external magnetic field is applied to the magnetoresistive layer 18 and a relative magnetization direction between the first ferromagnetic layer 13 and the second ferromagnetic layer 15 changes, a resistance value of the magnetoresistive layer 18 changes, and a magnetoresistive effect is exhibited.

The first ferromagnetic layer 13 and the second ferromagnetic layer 15 include a ferromagnetic Heusler alloy, and preferably, are formed of substantially a ferromagnetic Heusler alloy. In particular, the ferromagnetic Heusler alloy of the first ferromagnetic layer 13 and the second ferromagnetic layer 15 is preferably formed of a Heusler alloy expressed by a composition formula $Co_2QR$. In the composition formula, Q is one or more elements selected from a group consisting of Cr, Mn and Fe, and R is one or more elements selected from a group consisting of Al, Si, Ga, Ge, In, and Sn. By using such a ferromagnetic Heusler alloy, a spin polarization ratio of the first ferromagnetic layer 13 and the second ferromagnetic layer 15 can be increased. As a result, the magnetoresistive effect of the magnetoresistance effect element 1 can be increased.

Further, it is further preferable for the ferromagnetic Heusler alloy of the first ferromagnetic layer 13 and the second ferromagnetic layer 15 to be the ferromagnetic Heusler alloy expressed by the following general formula (1).

$$Co_2Q_\alpha R_\beta \qquad (1)$$

In the general formula (1), Q is one or more elements selected from a group consisting of Cr, Mn, and Fe, R is one or more elements selected from a group consisting of Al, Si, Ga, Ge, In, and Sn, and $2<\alpha+\beta<2.6$.

Since the Heusler alloy of the general formula (1) satisfies the condition of $2<\alpha+\beta<2.6$, half metal characteristics are easily maintained for the following reasons. That is, it has been theoretically shown that in the Heusler alloy expressed by the general formula (1), when Co is substituted with Q and R sites, a spin polarizability decreases, but when the elements of the Q and R sites are substituted with a Co site, an influence on the spin polarizability is small. Therefore, when $2<\alpha+\beta$, the substitution of Co with the Q and R sites is reduced, and accordingly, a decrease in spin polarizability due to element substitution is reduced. On the other hand, when $2.6\leq\alpha+\beta$, the amount of magnetization of the Heusler alloy decreases. Therefore, when the condition of $2<\alpha+\beta<2.6$ is satisfied in the Heusler alloy, half metal characteristics are easily maintained, and, as a result, the magnetoresistance effect element 1 can exhibit a large magnetoresistance effect.

$Co_2Mn_{\alpha-X}Fe_XSi_\beta(2<\alpha+\beta<2.6, \alpha>X)$ is particularly preferable as the Heusler alloy of the general formula (1), but $Co_2Mn_\alpha Al_{\beta-X}Si_X(2<\alpha+\beta<2.6, \alpha>X)$, $Co_2Fe_\alpha Ga_{\beta-X}Ge_X(2<\alpha+\beta<2.6, \alpha>X)$, $Co_2Fe_\alpha Al_{\beta-X}Si_X(2<\alpha+\beta<2.6, \alpha>X)$, or the like in which a large $\Delta RA$ (amount of magnetoresistance change x element area) can be obtained in a GMR element having a CPP structure is also preferable. Further, the first ferromagnetic layer 13 and the second ferromagnetic layer 15 may be formed of one type of ferromagnetic Heusler alloy, two or more types of ferromagnetic Heusler alloy, or a combination of a ferromagnetic Heusler alloy and a metal other than a Heusler alloy. Further, ferromagnetic Heusler alloys of the first ferromagnetic layer 13 and the second ferromagnetic layer 15 may be the same as each other or may be different from each other.

The nonmagnetic spacer layer 14 includes a nonmagnetic Fe group, Co group, or Ni group Heusler alloy, and is preferably formed of such a nonmagnetic Heusler alloy. When the nonmagnetic spacer layer 14 is formed of a nonmagnetic Heusler alloy, the nonmagnetic spacer layer 14, the first ferromagnetic layer 13, and the second ferromagnetic layer 15 are all formed of a Heusler alloy, and therefore, it is possible to crystallize the first ferromagnetic layer 13 and the second ferromagnetic layer 15 relatively easily. As a result, it is possible to increase a crystal orientation of the first ferromagnetic layer 13 and the second ferromagnetic layer 15. A thickness of the nonmagnetic spacer layer 14 is preferably equal to or greater than 1 nm and smaller than or equal to 10 nm.

Examples of the nonmagnetic Fe group Heusler alloy include $Fe_2TiSi$, $Fe_2ZrGe$, $Fe_2HfSn$, $Fe_2VAl$, $Fe_2TaAl$, $Fe_2NbGa$, $Fe_2CrZn$, $Fe_2MoCd$, $Fe_2WSr$, and $Fe_2ScBi$. Examples of the nonmagnetic Co group Heusler alloy include $Co_2ZnGe$, $Co_2ScAl$, and $Co_2ScGa$.

The antiferromagnetic layer 16 is provided on a surface of the second ferromagnetic layer 15 opposite to the nonmagnetic spacer layer 14. The antiferromagnetic layer 16 is exchange-coupled with the second ferromagnetic layer 15 and is used to impart unidirectional anisotropy to the second ferromagnetic layer 15 and substantially fix the direction of magnetization of the second ferromagnetic layer 15. Examples of a material of the antiferromagnetic layer 16 include an FeMn alloy, a PtMn alloy, a PtCrMn alloy, a NiMn alloy, an IrMn alloy, NiO, and $Fe_2O_3$. A thickness of the first ferromagnetic layer 13 can be, for example, equal to or greater than 1 nm and smaller than or equal to 20 nm, and a thickness of the second ferromagnetic layer 15 can be, for example, equal to or greater than 1 nm and smaller than or equal to 20 mn. A thickness of the antiferromagnetic layer 16 can be, for example, equal to or greater than 5 nm and smaller than or equal to 15 nm. For the first ferromagnetic layer 13 and the second ferromagnetic layer 15, when a coercive force of the second ferromagnetic layer 15 is greater than a coercive force of the first ferromagnetic layer 13 and has a magnitude such that a magnetization direction of the second ferromagnetic layer 15 is substantially fixed with respect to an external magnetic field that is a measurement target, for example, due to a scheme for changing the thicknesses of the layers, the antiferromagnetic layer 16 need not necessarily be provided.

The cap layer 17 is provided to protect the magnetoresistive layer 18. The cap layer 17 is formed of, for example, one or more of metal elements including Ru, Ag, Al, Cu, Au, Cr, Mo, Pt, W, Ta, Pd and Ir, an alloy of these metal elements, and a laminate of materials containing two or more of these metal elements. An upper electrode (not illustrated) for causing a current to flow through the magnetoresistance effect element 1 in a stacking direction may be provided on the cap layer 17.

A method of manufacturing the magnetoresistance effect element 1 includes, for example, a step of forming each of the underlayer 12, the first ferromagnetic layer 13, the nonmagnetic spacer layer 14, the second ferromagnetic layer 15, the antiferromagnetic layer 16, and the cap layer 17 on a substrate 11 using a sputtering method. In each step, a heat treatment may be performed, as necessary, or a magnetic field application process for imparting uniaxial magnetic anisotropy may be performed. A heat treatment may be appropriately performed at the same time in the magnetic field application process. Further, the magnetoresistance effect element 1 is subjected to microprocessing into a form in which the magnetoresistance characteristics can be evaluated, by lithography using an electron beam or the like and dry etching using Ar ions or the like.

According to the magnetoresistance effect element 1 of the embodiment as described above, since the nonmagnetic spacer layer 14 includes the nonmagnetic Fe group, Co group, or Ni group Heusler alloy, Fe, Co, or Ni that is a magnetic element contained in the nonmagnetic spacer layer 14 can be caused to be present near an interface between the first ferromagnetic layer 13 and the nonmagnetic spacer layer 14 and near an interface between the second ferromagnetic layer 15 and the nonmagnetic spacer layer 14. Accordingly, it is thought that stability of the magnetization directions of the first ferromagnetic layer 13 and the second ferromagnetic layer 15 near the interfaces is improved. As a result, variation in a value of RA of the magnetoresistance effect element 1 can be reduced.

Further, in the magnetoresistance effect element 1 of the embodiment, it is preferable that the nonmagnetic spacer layer 14 include a nonmagnetic Fe group Heusler alloy, and the nonmagnetic Heusler alloy contain the element Fe, an element L, and an element M, the element L being one or more elements selected from a group consisting of Ti, Zr, Hf, V, Nb, Ta, Cr, Mo, W, Sc, and Y, and the element M being one or more elements selected from a group consisting of Si, Ge, Sn, Al, Ga, In, Zn, Cd, Hg, Mg, Ca, Sr, Ba, P, As, Sb, and Bi.

By selecting such types of material for the nonmagnetic Fe group Heusler alloy, a small energy gap can be formed near a Fermi level of the nonmagnetic Heusler alloy, and electrical conduction characteristics of the nonmagnetic Heusler alloy can be semiconductive characteristics. Accordingly, it becomes easy to set the value of RA of the magnetoresistance effect element 1 to a desired value. A general formula of the nonmagnetic Heusler alloy of such a type of material is, for example, $Fe_2LM$, but a composition of the nonmagnetic Heusler alloy may deviate somewhat from this general formula without deviating from the gist of the present disclosure.

Further, in the magnetoresistance effect element 1 of the embodiment, it is preferable that the nonmagnetic spacer layer 14 include a nonmagnetic Fe group Heusler alloy, and the nonmagnetic Heusler alloy contain the element Fe, an element L, and an element M, the element L being one or more elements selected from a group consisting of Ti, Zr, Hf, V, Nb, Ta, Sc, and Y, and the element M being one or more elements selected from a group consisting of Si, Ge, Sn, Al, Ga, In, P, As, Sb, and Bi.

By selecting such types of material for the nonmagnetic Fe group Heusler alloy, it becomes easy to set the value of RA of the magnetoresistance effect element 1 to a desired value for the same reason as described above. Further, in the periodic table of the elements, a group (Group 3, Group 4, or Group 5) to which the element L belongs and a group (Group 13, Group 14, or Group 15) to which the element M belongs, and a group (Group 8) to which Fe belongs can be greatly separated from each other. Accordingly, it is possible to reduce element substitution between Fe and element L or element M in the nonmagnetic Heusler alloy of the nonmagnetic spacer layer 14. As a result, variation in the value of RA of the magnetoresistance effect element 1 can be further reduced.

Further, in the magnetoresistance effect element 1 of the embodiment, it is preferable that the nonmagnetic spacer layer 14 include a nonmagnetic Fe group Heusler alloy, and the nonmagnetic Heusler alloy contain the element Fe, an element L, and an element M, the element L being one or more elements selected from a group consisting of Ti, Zr, Hf, Sc, and Y, and the element M being one or more elements selected from a group consisting of Si, Ge, Sn, P, As, Sb, and Bi.

By selecting such types of material for the nonmagnetic Fe group Heusler alloy, it becomes easy to set the value of RA of the magnetoresistance effect element 1 to a desired value for the same reason as described above. Further, in the periodic table of the elements, a group (Group 3 or Group 4) to which the element L belongs and a group (Group 14 or Group 15) to which the element M belongs, and a group (Group 8) to which Fe belongs can be further greatly separated from each other. Accordingly, it is possible to further reduce element substitution between Fe and element L or element M in the nonmagnetic Heusler alloy of the nonmagnetic spacer layer 14. As a result, variation in the value of RA of the magnetoresistance effect element 1 can be further reduced.

Figure 2A:
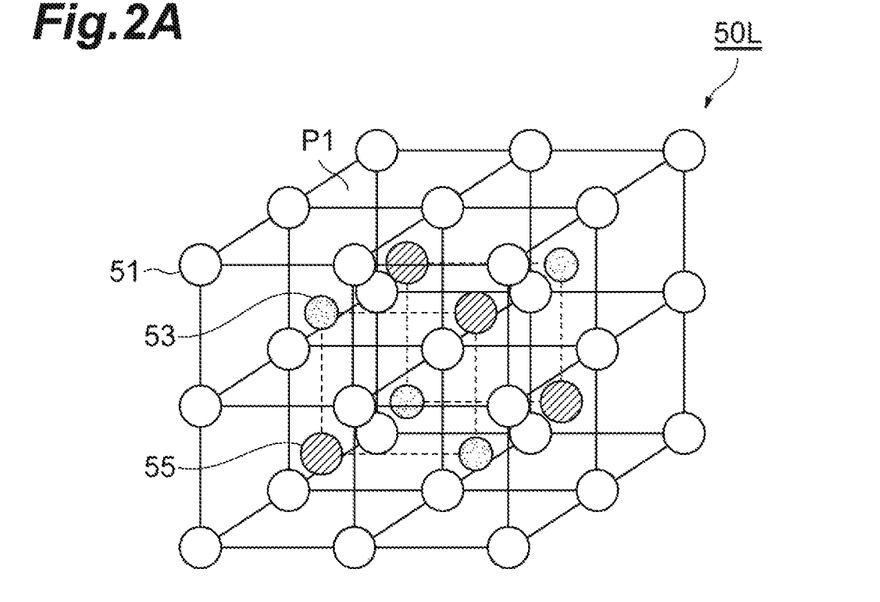
FIGS. 2A to 2C are schematic diagrams illustrating crystal structures of a Heusler alloy.
Figure 2B:
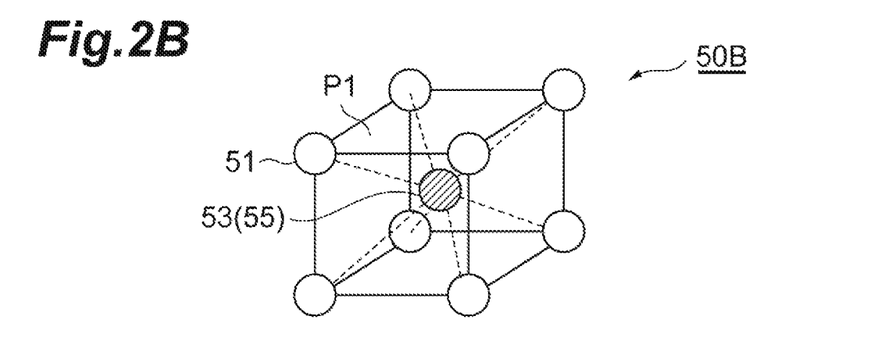
Figure 2C:
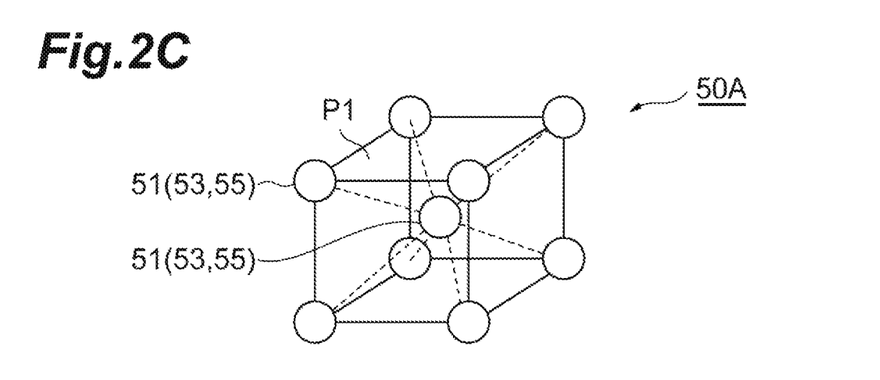

Further, in the magnetoresistance effect element 1 of the embodiment, it is preferable for the nonmagnetic Heusler alloy of the nonmagnetic spacer layer 14 to have a B2 structure or a $L2_1$ structure. This will be described with reference to FIGS. 2A to 2C. FIGS. 2A to 2C are schematic diagrams of a unit cell of a nonmagnetic Fe group Heusler alloy expressed by a general formula of $Fe_2LM$. FIG. 2A illustrates a unit cell 50L of a nonmagnetic Fe group Heusler alloy having a $L2_1$ structure, FIG. 2B illustrates a unit cell 50B of a nonmagnetic Fe group Heusler alloy having a B2 structure, and FIG. 2C illustrates a unit cell 50A of a nonmagnetic Fe group Heusler alloy having an A2 structure.

As illustrated in FIG. 2A, the unit cell 50L having a $L2_1$ structure includes four face-centered cubic lattice (fcc) sublattices. Fe 51 has a fcc structure with coordinates (0, 0, 0) and (½, ½, ½) as starting points. An element L53 has a fcc structure starting from (¼, ¼, ¼). An element M55 has a fcc structure starting from (¾, ¾, ¾). Further, as illustrated in FIG. 2B, a structure in which an element X53 and an element Y55 are irregularly arranged with respect to a $L2_1$ structure is a B2 structure. Further, as illustrated in FIG. 2C, with respect to a $L2_1$ structure, a structure in which Fe51, an element X53, and an element 55 are irregularly arranged is an A2 structure.

Here, when a (001) plane P1 of the $L2_1$ structure, the B2 structure, and the A2 structure is referred to, it is seen that the (001) plane P1 of the $L2_1$ structure and the B2 structure is formed of only Fe. In a fcc structure, the (001) plane is a preferred orientation plane. Therefore, by forming the nonmagnetic spacer layer 14 using a nonmagnetic Heusler alloy having a B2 structure or a $L2_1$ structure, it is possible to increase the amount of Fe, Co, or Ni which is a magnetic element contained in the nonmagnetic spacer layer 14 present near the interface between the first ferromagnetic layer 13 and the nonmagnetic spacer layer 14 and near the interface between the second ferromagnetic layer 15 and the nonmagnetic spacer layer 14, as compared with a case in which the nonmagnetic spacer layer 14 is formed of a non-magnetic Heusler alloy having an A2 structure. As a result, since the stability of the magnetization directions of the first ferromagnetic layer 13 and the second ferromagnetic layer 15 near the interfaces is further improved, variation in a value of RA of the magnetoresistance effect element 1 can be further reduced.

On the other hand, when the nonmagnetic spacer layer 14 is formed of a nonmagnetic Heusler alloy having an A2 structure, there are elements other than magnetic elements such as Fe on the (001) plane P1. Therefore, an effect of stabilizing the magnetization directions of the first ferromagnetic layer 13 and the second ferromagnetic layer 15 near the interface is relatively low.

EXAMPLES

Hereinafter examples of the present disclosure and comparative examples will be described in order to further clarify the effects of the magnetoresistance effect element of the present disclosure.

Figure 3:
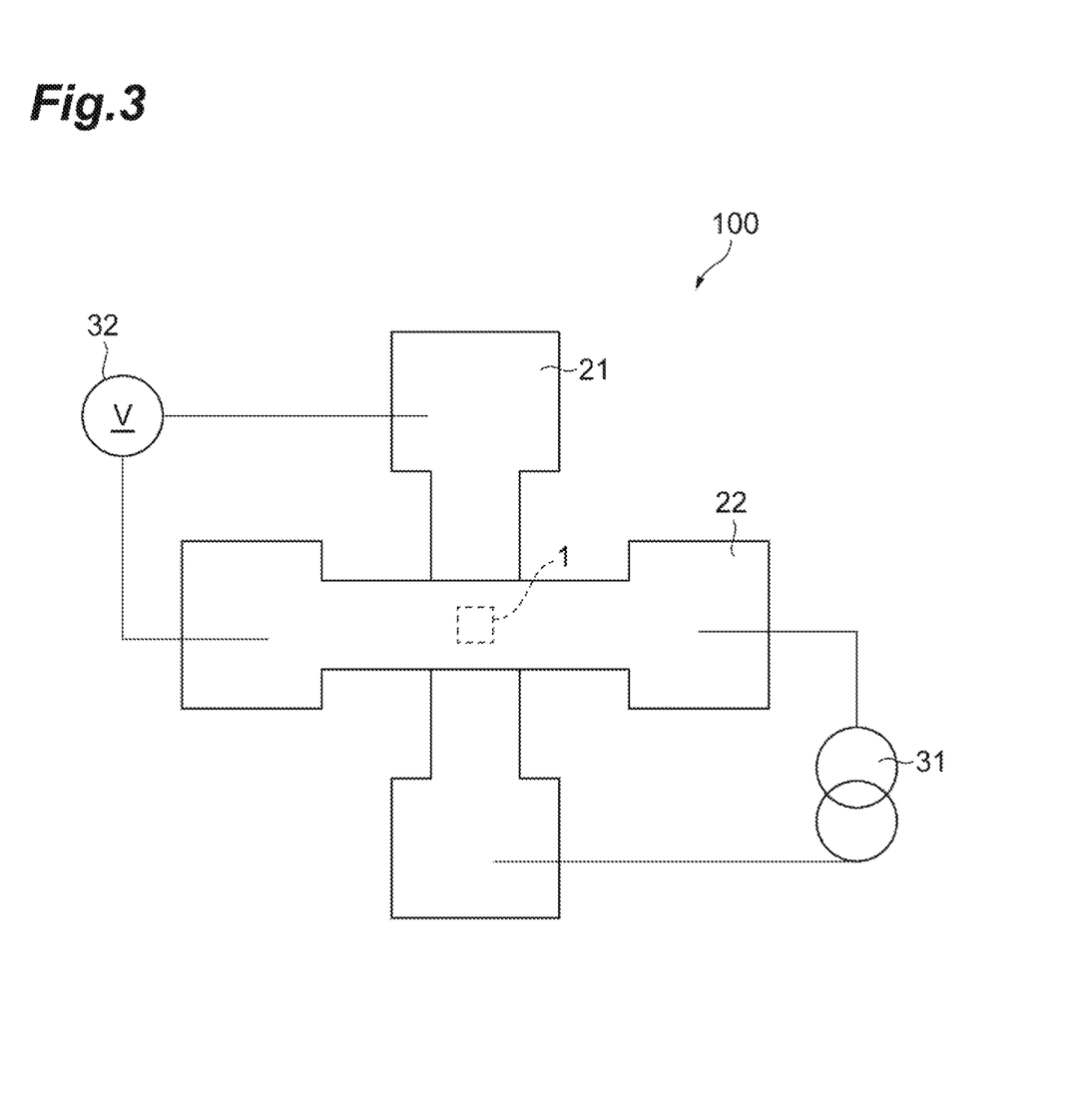
FIG. 3 is a schematic diagram of a magnetoresistive device including a magnetoresistance effect element according to the embodiment.

FIG. 3 is a schematic diagram of the magnetoresistive device 100 when viewed in a plan view in a stacking direction of the magnetoresistance effect element 1. The magnetoresistive device 100 can evaluate an MR ratio of the magnetoresistance effect element 1 according to the examples and the comparative example. Specifically, the magnetoresistive device 100 includes the magnetoresistance effect element 1 according to the above embodiment, two electrode layers 21, 22, a power supply 31, and a voltmeter 32. The magnetoresistance effect element 1 is disposed between the two electrode layers 21 and 22. The magnetoresistance effect element 1 includes an upper electrode provided on the cap layer 17 and a lower electrode provided between the substrate 10 and the underlayer 12. The upper electrode and the lower electrode are electrically connected to the two electrode layers 21 and 22, respectively. Both of the two electrode layers 21 and 22 are connected to the power supply 31 and the voltmeter 32. When a voltage is applied to the magnetoresistance effect element 1 by the power supply 31, a current flows in the stacking direction of the magnetoresistive layer 18, and a voltage applied to the magnetoresistance effect element 1 at this time can be monitored by the voltmeter 32. By monitoring the voltage applied to the magnetoresistance effect element 1 using the voltmeter 32 while sweeping a magnetic field from the outside to the magnetoresistance effect element 1 in a state in which a constant current is caused to flow through the magnetoresistance effect element 1 in the stacking direction, it is possible to measure a change in resistance of the resistance effect element 1. From a result of the measurement of the change in resistance, the MR ratio of the magnetoresistance effect element 1 can be calculated. With such a magnetoresistive device 100, the MR ratio and the like of Examples 1 to 11 and Comparative Example 1 prepared as described below were measured.

The MR ratio is generally expressed by the following equation.

$$MR \text{ ratio } (\%) (R_{AP} - R_P)/R_P \times 100$$

$R_P$ is the resistance of the magnetoresistance effect element when the magnetization directions of the first ferromagnetic layer 13 and the second ferromagnetic layer 15 are parallel, and $R_{AP}$ is the resistance of the magnetoresistance effect element when the magnetization directions of the first ferromagnetic layer 13 and the second ferromagnetic layer 15 are antiparallel. Further, when an area of a shape of the magnetoresistance effect element 1 when viewed in a plan view is A, $R_pA$ obtained by multiplying $R_p$ by A is defined as RA (area resistance). RA is a value normalized to a resistance value per unit area by dividing a resistance value obtained by dividing an applied bias voltage by a current flowing in the stacking direction of the magnetoresistance effect element, by a reciprocal of an area of a surface to which each layer is bonded. Here, $R_pA$ obtained by multiplying $R_p$ by the area is defined as RA. Further, the variation in the value of RA was defined as $3\sigma$ for RA ($\sigma$ is a standard deviation of RA) measured for ten magnetoresistance effect elements respectively having substantially the same area of a shape when viewed in a plan view, which were prepared on the same substrate for Examples 1 to 11 and Comparative Example 1 respectively. The structure of the magnetoresistance effect element 1 according to each example and comparative example was confirmed in an X-ray diffraction image, a cross-sectional transmission electron microscope image, and an electron beam diffraction image of each layer.

Example 1

The magnetoresistance effect element of Example 1 corresponding to the above embodiment will be described with reference to the magnetoresistance effect element 1 illustrated in FIG. 1. Note that, for convenience of explanation, the same reference numerals are used for the same or corresponding members in each figure.

A MgO substrate was used as the substrate 10, the underlayer 12 was formed by stacking Cr (10 nm) and Ag (100 nm) from the substrate 10 side, the first ferromagnetic layer 13 and the second ferromagnetic layer 15 were a ferromagnetic Heusler alloy of $Co_2MnSi$ (10 nm), the nonmagnetic spacer layer 14 was a nonmagnetic Heusler alloy of $Fe_2CrZn$ (2 nm), the antiferromagnetic layer 16 was IrMn (10 nm), and the cap layer 17 was Ru (5 nm). A value inside the parentheses is a film thickness, and a film formation of each layer was performed using a sputtering method.

After the second ferromagnetic layer 15 was formed, a heat treatment was performed at 450° C. to promote crystallization regularity of the first ferromagnetic layer 13, the nonmagnetic spacer layer 14, and the second ferromagnetic layer 15. After the cap layer 17 was formed, a heat treatment in a magnetic field for imparting uniaxial magnetic anisotropy to the second ferromagnetic layer 15 was performed. At this time, a heat treatment temperature was 300° C., and a magnetic field application strength was 5 kOe.

When a cross-sectional transmission electron microscope image and an electron beam diffraction image of each layer were confirmed after the heat treatment in the magnetic field, it was confirmed that the first ferromagnetic layer 13, the nonmagnetic spacer layer 14, and the second ferromagnetic layer 15 all had a B2 structure.

For the magnetoresistance effect element according to Example 1 prepared as described above, RA, an RA variation, $\Delta RA$, and a MR ratio were measured using the magnetoresistive device 100 described above.

Example 2

A magnetoresistance effect element according to Example 2 had the same configuration as the magnetoresistance effect element of Example 1 except that Fe$_2$TaAl (2 nm) was used in place of Fe$_2$CrZn (2 nm) for the nonmagnetic spacer layer 14, and preparation and measurement were performed using the same method as in Example 1.

Example 3

A magnetoresistance effect element according to Example 3 had the same configuration as the magnetoresistance effect element of Example 1 except that Fe$_2$TiSi (2 nm) was used in place of Fe$_2$CrZn (2 nm) for the nonmagnetic spacer layer 14, and preparation and measurement were performed using the same method as in Example 1.

Example 4

In a magnetoresistance effect element according to Example 4, preparation and measurement were performed using the same method as in Example 3 except that the second ferromagnetic layer 15 was formed and then heat treatment at 300° C. was performed in place of the heat treatment at 450° C.

When the cross-sectional transmission electron microscope image and the electron beam diffraction image of each layer of the magnetoresistance effect element of Example 4 were confirmed after the heat treatment in the magnetic field, it was confirmed that the first ferromagnetic layer 13, the nonmagnetic spacer layer 14, and the second ferromagnetic layer 15 all had a A2 structure.

Example 5

In a magnetoresistance effect element according to Example 5, preparation and measurement were performed using the same method as in Example 3 except that the second ferromagnetic layer 15 was formed and then a heat treatment at 550° C. was performed in place of the heat treatment at 450° C.

When the cross-sectional transmission electron microscope image and the electron beam diffraction image of each layer of the magnetoresistance effect element of Example 5 were confirmed after the heat treatment in the magnetic field, it was continued that the first ferromagnetic layer 13, the nonmagnetic spacer layer 14, and the second ferromagnetic layer 15 all had an L2$_1$ structure.

Examples 6 to 11

In magnetoresistance effect elements according to Examples 6 to 11, preparation and measurement were performed using the same method as in Example 3 except that a Heusler alloy of Co$_2$Q$_\alpha$R$_\beta$ in which a composition of Mn and Si with respect to Co varied was used in place of the Heusler alloy of Co$_2$MnSi (10 nm) for the first ferromagnetic layer 13 and the second ferromagnetic layer 15.

Comparative Example 1

In a magnetoresistance effect element according to Comparative Example 1, preparation and measurement were performed using the same method as in Example 1 except that Rh$_2$CuSn was used in place of Fe$_2$CrZn (2 nm) for the nonmagnetic spacer layer 14.

Table 1 shows measurement results of Examples 1 to 11 and Comparative Example 1.

TABLE 1

| | First ferromagnetic electrode layer | A + B | Nonmagnetic spacer layer | Second ferromagnetic electrode layer | Heat treatment temperature [° C.] | RA [Ωμm$^2$] | RA variation 3σ [Ωμm$^2$] | ΔRA [Ωμm$^2$] | MR Ratio [%] |
|---|---|---|---|---|---|---|---|---|---|
| Example 1 | Co$_2$MnSi | 2 | Fe$_2$CrZn | Co$_2$MnSi | 450 | 0.19 | 0.075 | 0.020 | 10.5 |
| Example 2 | Co$_2$MnSi | 2 | Fe$_2$TaAl | Co$_2$MnSi | 450 | 0.28 | 0.062 | 0.030 | 10.7 |
| Example 3 | Co$_2$MnSi | 2 | Fe$_2$TiSi | Co$_2$MnSi | 450 | 0.32 | 0.043 | 0.035 | 10.9 |
| Example 4 | Co$_2$MnSi | 2 | Fe$_2$TiSi | Co$_2$MnSi | 450 | 0.31 | 0.082 | 0.010 | 3.2 |
| Example 5 | Co$_2$MnSi | 2 | Fe$_2$TiSi | Co$_2$MnSi | 450 | 0.32 | 0.042 | 0.038 | 11.9 |
| Example 6 | Co$_2$Mn$_{1.1}$Si$_{0.95}$ | 2.05 | Fe$_2$TiSi | Co$_2$Mn$_{1.1}$Si$_{0.95}$ | 450 | 0.29 | 0.039 | 0.053 | 18.3 |
| Example 7 | Co$_2$Mn$_{1.1}$Si$_{0.95}$ | 2.15 | Fe$_2$TiSi | Co$_2$Mn$_{1.1}$Si$_{0.95}$ | 450 | 0.3 | 0.041 | 0.064 | 21.3 |
| Example 8 | Co$_2$Mn$_{1.1}$Si$_{0.95}$ | 2.25 | Fe$_2$TiSi | Co$_2$Mn$_{1.1}$Si$_{0.95}$ | 450 | 0.31 | 0.042 | 0.072 | 23.2 |
| Example 9 | Co$_2$Mn$_{1.1}$Si$_{0.95}$ | 2.45 | Fe$_2$TiSi | Co$_2$Mn$_{1.1}$Si$_{0.95}$ | 450 | 0.3 | 0.042 | 0.050 | 16.7 |
| Example 10 | Co$_2$Mn$_{1.1}$Si$_{0.95}$ | 2.55 | Fe$_2$TiSi | Co$_2$Mn$_{1.1}$Si$_{0.95}$ | 450 | 0.31 | 0.039 | 0.045 | 14.5 |
| Example 11 | Co$_2$Mn$_{1.1}$Si$_{0.95}$ | 2.6 | Fe$_2$TiSi | Co$_2$Mn$_{1.1}$Si$_{0.95}$ | 450 | 0.32 | 0.041 | 0.038 | 11.9 |
| Comparative Example 1 | Co$_2$MnSi | 2 | Rh$_2$CuSn | Co$_2$MnSi | 450 | 0.08 | 0.183 | 0.003 | 3.8 |

As shown in Table 1, the variation (3σ) of the value of RA was 0.075 Ωum$^2$ in Example 1, 0.062 Ωum$^2$ in Example 2, 0.043 Ωum$^2$ in Example 3, 0.082 Ωum$^2$ in Example 4, 0.042 Ωum$^2$ in Example 5, 0.039 Ωum$^2$ in Example 6, 0.041 Ωum$^2$ in Example 7, 0.042 Ωum$^2$ in Example 8, 0.042 Ωum$^2$ in Example 9, 0.039 Ωum$^2$ in Example 10, and 0.041 Ωum$^2$ in Example 11, which were all smaller than 0.183 Ωum$^2$ in Comparative Example 1.

Further, the variation in the value of RA is smaller in the order of Example 1, Example 2, and Example 3. This shows that, for Fe$_2$LM used for the nonmagnetic spacer layer 14, variation in RA becomes smaller when a group to which the X element belongs and a group to which the Y element belongs are separated from Fe of Group 8 in the periodic table of the elements. Further, it was shown from a comparison between Example 3, Example 4, and Example 5 that a crystal structure of the nonmagnetic spacer layer 14 is preferably a B2 structure or an L2$_1$ structure rather than an A2 structure in terms of the variation in RA value. Further, it was shown from the results of Example 3 and Examples 6 to 11 that the MR ratio is particularly increased by setting a sum of α and β in Co$_2$Q$_\alpha$R$_\beta$ to be greater than 2 and smaller than 2.6.

What is claimed is:
1. A magnetoresistance effect element comprising:
   a first ferromagnetic layer as a magnetization fixed layer including a ferromagnetic Heusler alloy;
   a second ferromagnetic layer as a magnetization free layer including a ferromagnetic Heusler alloy; and a nonmagnetic spacer layer provided between the first ferromagnetic layer and the second ferromagnetic layer, wherein the nonmagnetic spacer layer includes a nonmagnetic (i) Fe group Heusler alloy selected from the group consisting of $Fe_2TiSi$, $Fe_2ZrGe$, $Fe_2HfSn$, $Fe_2TaAl$, $Fe_2NbGa$, $Fe_2CrZn$, $Fe_2MoCd$, $Fe_2WSr$, and $Fe_2ScBi$, or (ii) Co group Heusler alloy selected from the group consisting of $Co_2ZnGe$, $Co_2ScAl$, and $Co_2ScGa$.

2. The magnetoresistance effect element according to claim 1, wherein the nonmagnetic Heusler alloy has a B2 structure or a $L2_1$ structure.

3. The magnetoresistance effect element according to claim 2, wherein at least one of the ferromagnetic Heusler alloy included in the first ferromagnetic layer and the second ferromagnetic layer includes a Heusler alloy expressed by a composition formula of $Co_2QR$, Q is one or more elements selected from the group consisting of Cr, Mn, and Fe, and R is one or more elements selected from the group consisting of Al, Si, Ga, Ge, In, and Sn.

4. The magnetoresistance effect element according to claim 1, wherein at least one of the ferromagnetic Heusler alloy included in the first ferromagnetic layer and the second ferromagnetic layer includes a Heusler alloy expressed by a composition formula of $Co_2QR$, Q is one or more elements selected from the group consisting of Cr, Mn, and Fe, and R is one or more elements selected from the group consisting of Al, Si, Ga, Ge, In, and Sn.

5. The magnetoresistance effect element according to claim 1, wherein at least one of the ferromagnetic Heusler alloy included in the first ferromagnetic layer and the second ferromagnetic layer includes a Heusler alloy expressed by general formula (1):

$$Co_2Q_\alpha R_\beta \qquad (1)$$

where Q is one or more elements selected from a group consisting of Cr, Mn, and Fe, R is one or more elements selected from a group consisting of Al, Si, Ga, Ge, In, and Sn, and $2<\alpha+\beta<2.6$.

6. The magnetoresistance effect element according to claim 1, wherein the nonmagnetic spacer layer includes the nonmagnetic Fe group Heusler alloy.

7. The magnetoresistance effect element according to claim 6, wherein the nonmagnetic Heusler alloy has a B2 structure or a $L2_1$ structure.

8. The magnetoresistance effect element according to claim 7, wherein at least one of the ferromagnetic Heusler alloy included in the first ferromagnetic layer and the second ferromagnetic layer includes a Heusler alloy expressed by a composition formula of $Co_2QR$, Q is one or more elements selected from the group consisting of Cr, Mn, and Fe, and R is one or more elements selected from the group consisting of Al, Si, Ga, Ge, In, and Sn.

9. The magnetoresistance effect element according to claim 6, wherein at least one of the ferromagnetic Heusler alloy included in the first ferromagnetic layer and the second ferromagnetic layer includes a Heusler alloy expressed by a composition formula of $Co_2QR$, Q is one or more elements selected from the group consisting of Cr, Mn, and Fe, and R is one or more elements selected from the group consisting of Al, Si, Ga, Ge, In, and Sn.

* * * * *